(12) United States Patent
Boudreau et al.

(10) Patent No.: US 10,106,457 B2
(45) Date of Patent: Oct. 23, 2018

(54) VAPOR DEPOSITION SYSTEMS AND PROCESSES FOR THE PROTECTION OF GLASS SHEETS

(71) Applicant: Corning Incorporated, Corning, NY (US)

(72) Inventors: Robert Addison Boudreau, Corning, NY (US); Darwin Gene Enicks, Corning, NY (US); Charles Andrew Paulson, Painted Post, NY (US); Gary Richard Trott, San Mateo, CA (US)

(73) Assignee: CORNING INCORPORATED, Corning, NY (US)

( * ) Notice: Subject to any disclaimer, the term of this patent is extended or adjusted under 35 U.S.C. 154(b) by 140 days.

(21) Appl. No.: 14/359,806

(22) PCT Filed: Nov. 14, 2012

(86) PCT No.: PCT/US2012/064925
§ 371 (c)(1),
(2) Date: May 21, 2014

(87) PCT Pub. No.: WO2013/078040
PCT Pub. Date: May 30, 2013

(65) Prior Publication Data
US 2014/0352355 A1 Dec. 4, 2014

Related U.S. Application Data

(60) Provisional application No. 61/563,116, filed on Nov. 23, 2011.

(51) Int. Cl.
*C03C 17/245* (2006.01)
*C03B 17/06* (2006.01)
*C23C 16/455* (2006.01)

(52) U.S. Cl.
CPC .......... *C03C 17/245* (2013.01); *C03B 17/064* (2013.01); *C03C 17/2453* (2013.01);
(Continued)

(58) Field of Classification Search
CPC .............. C03C 17/245; C03C 2218/10; C03C 2217/22; C03C 2217/211; C03C 17/2453; C03C 2217/78; C03B 17/064
(Continued)

(56) References Cited

U.S. PATENT DOCUMENTS 3,338,696 A 8/1967 Dockerty
3,682,609 A 8/1972 Dockerty
(Continued)

FOREIGN PATENT DOCUMENTS

WO 1990010307 A1 9/1990

OTHER PUBLICATIONS

Chinese First Office Action CN201280056924.2 dated Sep. 13, 2016, Chinese Patent Office.
(Continued)

*Primary Examiner* — Joseph S Del Sole
*Assistant Examiner* — Mohamed K Ahmed Ali
(74) *Attorney, Agent, or Firm* — Gregory V. Bean (57) ABSTRACT

A method of coating a surface of a glass ribbon during a drawing process using atmospheric vapor deposition is provided. The method includes forming a glass ribbon in a viscoelastic state, desirably with a fusion draw. The glass ribbon is drawn in the viscoelastic state. The glass ribbon is cooled in the viscoelastic state into an elastic state. The glass ribbon is directed into an open end of a reactor. The reactor includes multiple channels. A first channel directs a first reactant gas, a second channel directs a second reactant gas
(Continued)

and one or more third channels draw excess reactant, or purge it with inert gas flow, or both.

8 Claims, 6 Drawing Sheets

(52) U.S. Cl.
CPC .. *C23C 16/45595* (2013.01); *C03C 2217/211* (2013.01); *C03C 2217/214* (2013.01); *C03C 2217/22* (2013.01); *C03C 2217/78* (2013.01); *C03C 2218/15* (2013.01)

(58) Field of Classification Search
USPC .... 65/25.3, 32.4, 32.5, 53, 60.1, 60.5, 60.52
See application file for complete search history.

(56) References Cited

U.S. PATENT DOCUMENTS

| | | | |
|---|---|---|---|
| 5,041,150 A * | 8/1991 | Grundy | C03C 17/002 118/326 |
| 7,789,961 B2 | 9/2010 | Nelson et al. | |
| 7,850,780 B2 | 12/2010 | Levy et al. | |
| 7,851,380 B2 | 12/2010 | Nelson et al. | |
| 8,143,326 B2 | 3/2012 | Ittel et al. | |
| 8,758,851 B2 | 6/2014 | Rajala et al. | |
| 2005/0029613 A1 * | 2/2005 | Fujisawa | C03C 17/3464 257/436 |
| 2009/0214770 A1 * | 8/2009 | Chatterjee | C03C 17/002 427/168 |
| 2009/0217704 A1 * | 9/2009 | Shiraishi | C03B 17/062 65/91 |
| 2010/0126227 A1 | 5/2010 | Fekety et al. | |
| 2010/0159240 A1 | 6/2010 | Shah et al. | |
| 2010/0279569 A1 * | 11/2010 | Shah | B82Y 30/00 442/180 |

OTHER PUBLICATIONS

Garcia-Avuso et al. "Atomic force microscopy (AFM) morphological surface characterization of transparent gas barrier coatings on plastic films," Surface and Coatings Technology 80 (1996) 203-206.
International Search Report and Written Opinion PCT/US201264925 dated Feb. 15, 2013.
Jackson et al. Thin Solid Films, 77 (1981) 23-39 "Experience on the control and evaluation of coatings on glass containers".
Kennedy et al. "Stress-free aging of optical fibers in liquid water and humid environments," Proceedings of the SPIE, 1580, 152-62, (1992).
Kirkjian et al. "Dependence of fiber strength on time, temperature and relative humidity," Proceedings of the SPIE, 2290, 54-5, (1994).
Southwick et al. "The Mechanical Properties of Films for the Protection of Glass Surfaces." Thin Solid Films, v 77, n 1-2-3, p. 41-50, Mar. 6, 1980.
Tartivel et al. "Protection of glass from scratches: The use of a hard, thin coating to minimize damage", Materials Research Society Symposium Proceedings, v 977, p. 12-13, 2006, Processing-Structure-Mechanical Property Relations in Composite Materials.
Zuerbig et al. "Titania Surface Treatment of Glass Containers." Glastechnische Berichte, v 57, n 9, p. 237-243, 1984 Language: German.

* cited by examiner

VAPOR DEPOSITION SYSTEMS AND PROCESSES FOR THE PROTECTION OF GLASS SHEETS

This application claims the benefit of priority under 35 U.S.C. § 119 of U.S. Provisional Application Ser. No. 61/563,116 filed Nov. 23, 2011 the content of which is relied upon and incorporated herein by reference in its entirety.

FIELD

The present specification generally relates to the protection of thin flexible glass substrates or sheets that could be used in building electronic devices such as displays, area lighting, photovoltaic sheets, or in passive structures such as vapor barriers, lightweight transparent sheets, commercial packaging to hold, protect, or present other products, or materials able to withstand higher temperatures than normally found for plastics.

BACKGROUND

Thin flexible glass has advantages over plastic in the areas of transparency, hermeticity, dimensional stability, surface smoothness, resistance to scratching and wrinkling. The main challenge with flexible glass is that if there is a small flaw in its surface or at an edge it could serve as a source of origin for a crack, which could cause breakage. Glass has high compressive strength but has low tensile strength in the presence of defects.

It is known that optical fiber made of glass can have high tensile strength as long as the surface of the glass is coated and protected immediately after the fiber is made. Optical fiber is made by pulling on the end of a thicker rod of glass as it is heated, pulling it down to a very small diameter, on the order of 125 microns, coating it with layers, and then winding it on a spool. A critical part of this process, though, is coating the fiber immediately after it is formed before anything else is done with it. The breakage strength of optical fiber drops drastically upon simple exposure to the atmosphere. Oxygen and moisture can attack the glass surface and create microscopic defects that can initiate a propagating crack.

One method for manufacturing glass is by the draw process. Two examples of draw are redraw and fusion draw. With redraw, such as is used in making optical fiber, there is a starting piece of glass that is in a shape that is similar to what is desired in a product but is larger in cross sectional area. The end is heated and it is pulled like candy taffy in a controlled way and extended to a vastly longer dimension. In contrast, fusion draw is usually used to make sheets of glass by overflowing a trough that looks like a rain gutter. The glass overflows on both sides and merges together to form a sheet of glass below the trough as it is pulled through. The glass can be pulled from the bottom of the trough resulting in very thin glass that can then be bent and wound on a spool.

A number of coatings can serve to protect the surface of glass to prevent crack initiation, which could then prevent crack propagation. Of particular interest are inorganic coatings that FIG protect the glass while still allowing the glass to be used in processes at high temperature where plastics might fail.

SUMMARY

Various embodiments may include one or more of the following features. An atmospheric technique for coating a glass ribbon or sheet with an inorganic coating while the glass is fresh off of a glass draw, before the glass is in contact with solid surfaces of any kind, in combination with a technique that supports the glass during coating without touching the glass surface with any other solid material, such as by the use of gas pressure between a reactor head and the glass to levitate and control the virgin glass above a lower portion of the reactor head in a horizontal on other non-vertical configuration, or between two portions of the reactor head in a vertical configuration. The gas pressure is created by the flow of filtered gasses toward the surface of the glass creating a particle free zone for the deposition process. This is one aspect that can help to maintain the defect free state of the untouched glass directly after the draw.

In another desirable aspect, a very thin glass in ribbon form may be used in conjunction with a vapor deposition process for depositing an inorganic coating. The thin ribbon allows bending onto rolls or around tight corners in a factory installation, allowing for a continuous coating apparatus and/or a continuous coating operation. Glass thin enough to bend readily may facilitate conformation to the air bearing provided by the reactor head. Very thin glass ribbon-like glass also happens to be the glass material that can most benefit from an non-contact, just-off-the-draw coating apparatus and process, since the very thin glass has a relatively larger proportion of its mechanical strength determined by the state of its surface, and the pristine ideal chemical and physical properties of the surface are preserved by the coating methods and apparatus of the present disclosure.

In another aspect of the present disclosure gas confinement technology is employed, at atmospheric pressure, in conjunction with mild vacuum and purge channels, desirably with gas "bumpers" (inert gas flows) in close combination with mild vacuum channels—to carry away the reaction byproducts. This aspect can enable tight control of the reactions within the atmospheric vapor deposition technology described herein, and provide deposited films of high quality. A clam shell design is also provided, for a reactor head. This clam shell design can allow easy placement or threading of the glass sheet into the reactor head.

Further, the resulting deposited film according to aspects of the present disclosure can provide a hermetic seal, conformal over all sides and edges of the glass. This may seal potassium or other ions, or water, inside of the glass article. Likewise, this conformal film can seal out a broad range of materials including oils, alkalis, water, metallics, etc, from the surface of the glass article. Since this film generally prevents the transport of molecules across the glass surface, this invention thus provides a path to maintain the composition of glass articles the properties of which can degrade with compositional changes from contamination of the surface.

According to yet other aspects, if the glass sheet or ribbon is coated at elevated temperatures with a film material having a thermal expansion coefficient that is higher than that of the glass, then, as the coated glass cools, the can impart a compressive stress to the surface of the glass. This can enhance the wear resistance and toughness of the glass directly off of the draw. The wear resistance is a key attribute that is desired for maintaining the durability of very thin glass, since the durability of the glass sheet is necessarily decreased as it is made thinner.

Additional features and advantages of the claimed subject matter will be set forth in the detailed description which follows, and in part, will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Embodiments described herein generally relate to an atmospheric process for atomic layer deposition (ALD) at a bottom of a glass ribbon forming machine, known as a draw, wherein it is possible to immediately protect surfaces of the glass ribbon with a high quality coating which can prevent defects in the glass surface from arising, resulting in a high strength glass ribbon. The glass ribbon preferably can be sufficiently thin to be guided through the system using air bearings. The glass ribbon remains untouched by solid objects prior to coating so that the glass ribbon will not bear any of the defects that would result from this contact. The coating technologies that are described herein will maintain the pristine surface of the glass ribbon just after forming.

The following discussion is in terms of a fusion draw process (also known as a fusion process, an overflow downdraw process, or an overflow process), it being understood that the methods and apparatus disclosed and claimed herein may also applicable to other draw processes. As there are known fusion draw processes, various details are omitted so as to not overburden or obscure the description of the present disclosure. For example, fusion draw processes are described in U.S. Pat. No. 3,682,609 and U.S. Pat. No. 3,338,696.

Figure 1:
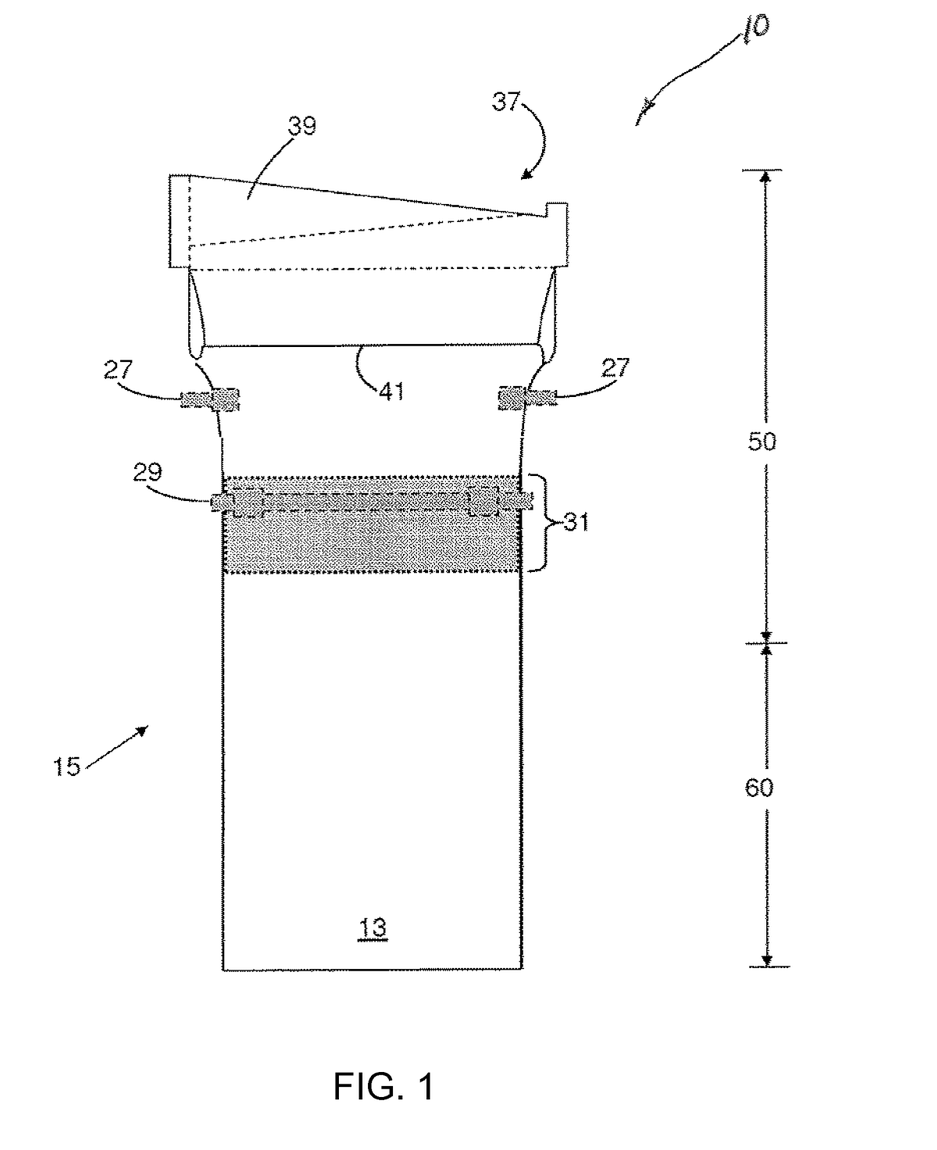
FIG. 1 is a schematic illustration of an embodiment of a fusion draw process.
Figure 2:
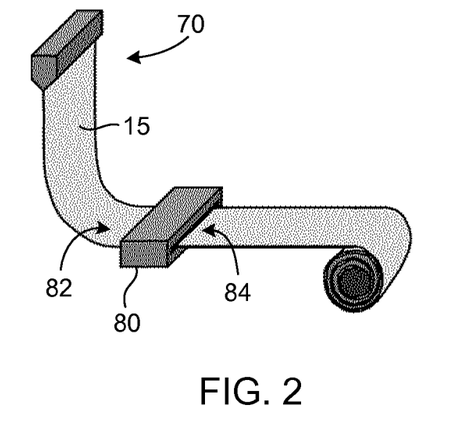
FIG. 2 is a schematic perspective view of a glass draw, showing a bend at the bottom of the draw, a deposition reactor, and a take-up loop to spool the glass sheet and to assist in maintaining web tension.

As shown in FIG. 1, a fusion process 10 employs a forming structure (isopipe) 37, which receives molten glass in a cavity 39. The isopipe includes root 41 where molten glass from the isopipe's two converging sides join together to form glass ribbon 15. After leaving the root, the glass ribbon 15 first traverses edge rollers 27 and then pulling rolls 29. As the glass ribbon 15 moves down the draw, the glass ribbon 15 passes through its glass transition temperature region (GTTR), shown schematically at 31 in FIG. 1. At positions above the glass transition temperature (GTT), the glass ribbon 15 behaves basically like a viscous liquid. At temperatures below the GTT, the glass ribbon 15 behaves basically like an elastic solid. As the glass ribbon 15 cools from a higher temperature through GTT while moving through the GTTR, the glass ribbon 15 does not show an abrupt transition from viscous to elastic behavior. Instead, the viscosity of the glass ribbon 15 gradually increases, and goes through a visco-elastic regime where both viscous and elastic responses are noticeable, and eventually it behaves as an elastic solid.

Although the GTT will vary with the particular glass being processed, as representative values for LCD-type glasses, the upper end temperature of the GTT is typically less than or equal to about 850° C. and the lower end of the GTT is typically greater than or equal to about 650° C., e.g., the lower end of the GTT can be greater than or equal to about 700° C.

Edge rollers 27 contact the glass ribbon 15 at a location above the GTTR in FIG. 1, while pulling rolls 29 are shown as being located within the GTTR. Pulling rolls can also be located below the GTTR, if desired. The temperature of the edge rollers 27 may be below that of the glass ribbon 15 at their point of contact, for example, the edge rollers 27 may be water or air cooled. As a result of this lower temperature, the edge rollers 27 may locally reduce the temperature of the glass ribbon 15. This cooling can reduce the attenuation of the glass ribbon 15, i.e., the local cooling can help control the reduction in the ribbon's width that occurs during drawing (e.g., through the action of pulling rolls 29). Pulling rolls 29 may also be generally cooler than the glass ribbon 15 they contact, but because the pulling rolls 29 are located further down the draw, the difference in temperature can be less than at the edge rollers 27. Both edge rollers 27 and pulling rolls 29 contact the glass ribbon 15 only at or near the edges of the ribbon 15, leaving a large portion of the surface 13 of the ribbon 15 untouched by any solid object.

As shown in FIG. 1, the apparatus used in the fusion process can be divided into a first section 50 (also referred to herein as the Fusion Draw Machine or FDM) and a second section 60 (also referred to herein as the Bottom of the Draw or BOD). In the first section 50, the glass ribbon 15 is relatively viscous, as indicated above, and the glass ribbon 15 may be cooled at a relatively high rate at temperatures above the glass transition region 31, illustratively in a range of approximately 6° C./in. to approximately 15° C./in. This region may be approximately 10 inches to 15 inches from the root 41. Next, at the upper portion of the glass transition region 31, the rate of cooling may be reduced to in the range of approximately 4° C./in. to approximately 10° C./in. This slower cooling rate may be continued for the next approximately 10 inches and approximately 15 inches. It is noted that the cooling rate in this first section 50 before and after root 41 may be controlled by adjusting heating/cooling power to the glass ribbon surface.

Figure 3:
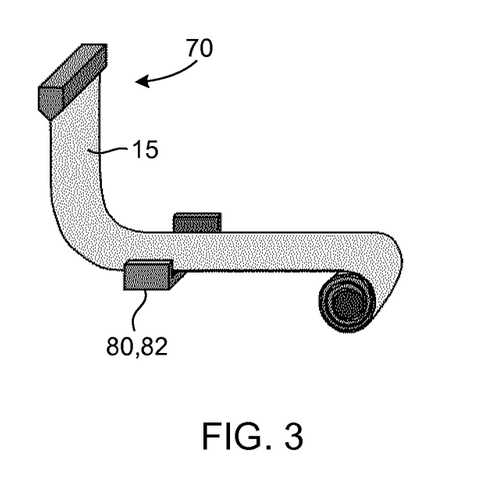
FIG. 3 is another view of the glass draw of FIG. 2, showing the deposition reactor with a removable top removed, which removable top may be useful for threading the ribbon through the reactor section.
Figure 4:
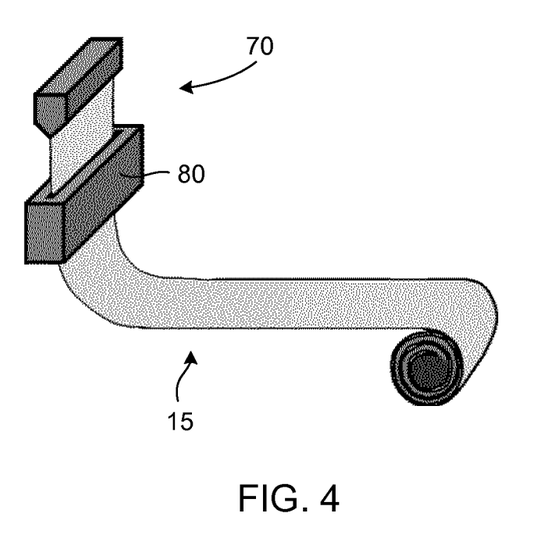
FIG. 4 is an alternate arrangement to that of FIGS. 2 and 3, having the deposition reactor positioned at a location on the vertical section of the glass ribbon coming down from the draw. Here gravity cannot be used to hold the glass ribbon in position on the surface of the deposition reactor head. However, the deposition head may be provided with gas jets on each side designed and balanced to hold the glass ribbon in the middle of the reactor.

With reference to FIGS. 2 through 7, an atmospheric vapor deposition reactor 80 and a process for coating of glass ribbon materials 15 is described herein. The reactor 80 is essentially a box that is open at its input and output ends 82, 84 (see FIG. 2). A glass ribbon 15 off of a glass ribbon draw 70 enters the reactor 80 and is floated atop a flow of gas, much like an air hockey table. The deposition reactor 80 may include a removable top or side, detachable from a bottom portion 82, as shown in FIG. 3, which removable top may be useful for threading the ribbon 15 through (or placing the ribbon 15 into) the reactor 80. Desirably, the removable top or side extends to a width equal to the width of a glass ribbon 15 to be processed. In addition to the horizontal orientation shown in FIGS. 2 and 3, the reactor 80 may also have a vertical (and any other other-than-horizontal) orientation. A reactor 80 with a vertical orientation is shown in the schematic perspective view of FIG. 4.

Figure 5:
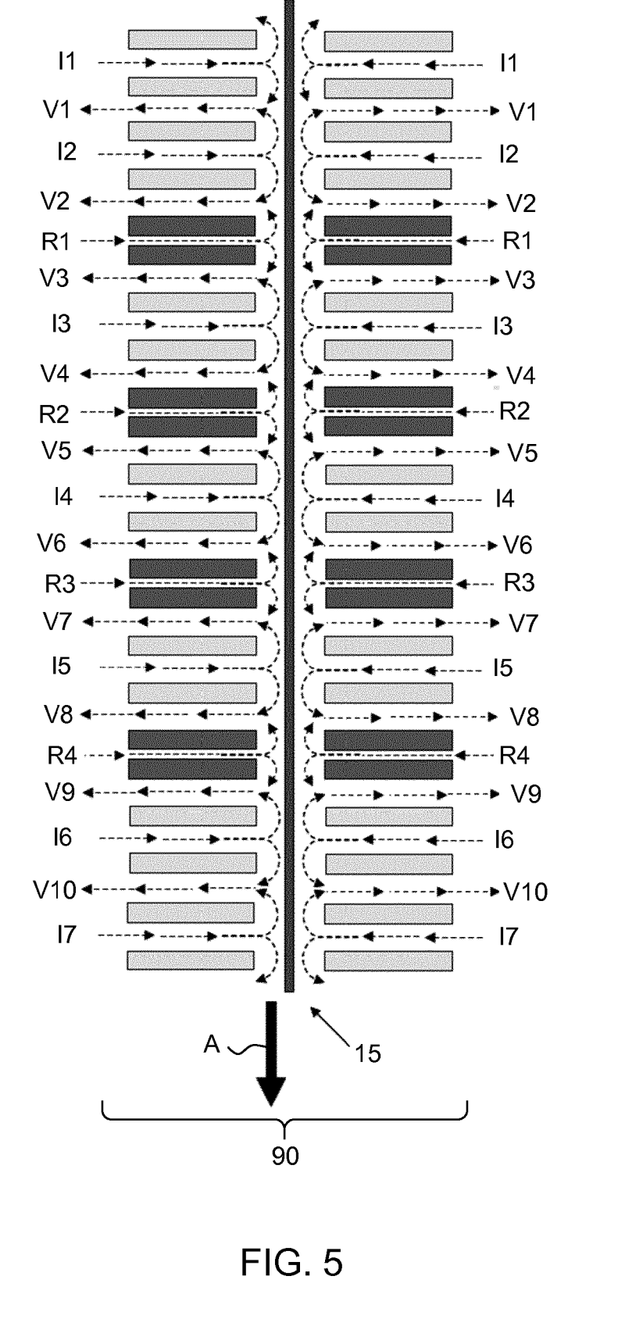
FIG. 5 is a detailed schematic side view of one embodiment of a deposition head of one embodiment of a deposition reactor. This figure shows channels that enable input and extraction of gasses and vapors, to and from the glass surface. The distance between the glass sheet and the reactor head can be set and maintained by the gas pressure at the input nozzles. Inert gas purging and channels and mild vacuum are both employed in this embodiment to remove reactant byproducts from the region near to the glass surface. The gas flow directions are indicated with arrows.

As best understood from the cross section of FIG. 5, which is a detailed schematic side view of one embodiment of a deposition head 90 of one embodiment of a deposition reactor 80, and from the perspective views of FIGS. 7a and 7b, the reactant gasses are made to flow onto and across the top, bottom and sides of the glass ribbon 70. As seen in FIG. 5, there are spatially defined regions for each reactant gas (such as an oxidant or a reductant). This is illustrated in FIG. 5. The number and the spacing of reactant gas flows can be adjusted to suit a particular coating. For instance, reactant channels R1, R2, R3, R4 in FIG. 5 could be used to flow reactants that consist of trimethylaluminum ($[CH_3]_3AL$ or "TMAl") at channels R1, $H_2O$ at channels R2, TMAl at position channels R3, and $H_2O$ at channels R4, for production of an $Al_2O_3$ coating. Alternatively, the reactant channels in FIG. 5 could be used to flow reactants that consist of monobutyltintrichloride at channels R1, $H_2O$ at channels R2, monobutyltintrichloride at channels R3, and $H_2O$ at channels R4, for production of a $SnO_2$ coating. The number and the spacing of inert gas flows and vacuum channels could likewise be adjusted to suit a particular coating application, including those requiring more than two species of reactant flows, for example.

Before and after each of the reactant channels R4, it is desirable to provide a mild vacuum through a respective vacuum channel V1, V2, V3, V4, V5, V6 as indicated by the arrows in FIG. 5. The Vacuum channels V1, V2, V3, V4, V5, V6 are desirably bordered on each side not bordered by a reaction channel R1, R2, R3, R4 (in the direction of the motion of the glass 15 as indicated by arrow A) by inert-gas curtains or "bumpers" produced by flow of an inert gas (or of a gas inert to the glass and to the deposition process) through a respective inert gas channel I1, I2, I3, I4, I5, I6, I7. This arrangement and structure effective and efficient delivery of reactant species and extraction of excess or by-product gasses and vapors, to and from the glass surface. Further distance between the glass sheet 15 and the two halves of the reactor 90 head (left and right in the figure) can be set and maintained by the gas pressure at the input channels, which include the reactant channels R1-R4 and the inert gas channels I1-I7. Inert gas purging and channels I1-I7 and vacuum channels V1-V10 with mild vacuum are both employed in this embodiment to remove reactant byproducts from the region near to the glass surface, although mild vacuum alone or inert gas purging alone may be sufficient in some applications.

As seen in FIGS. 7a and 7b, which is a detailed drawing of a perspective view of the bottom portion 82 of alternative embodiments of a reactor head 80, showing that the regions defined by the gas flows shown in FIG. 5 may be created by slots or channels 84 but also by round or other-shaped orifices 86. Also, the orifices or nozzles of whatever shape are desirably positioned on all sides of the reactor, as shown, or are desirably at least so positioned such that the resulting coating is deposited on all sides, even the thin edges of the glass 15.

Figure 6:
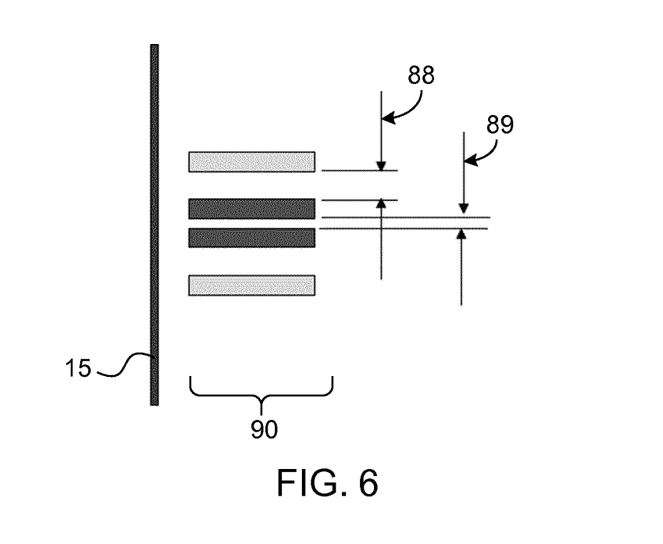
FIG. 6 is a detailed schematic drawing of the nozzles the reactor heads. The spacing or size of all of the channels can be tuned, to suit the chemistry and reactive flow conditions of the desired coating. All channels can be tuned, including the reactant channel, the vacuum channel, and the purge channels. In addition there can be a localized energy source.
Figure 7:
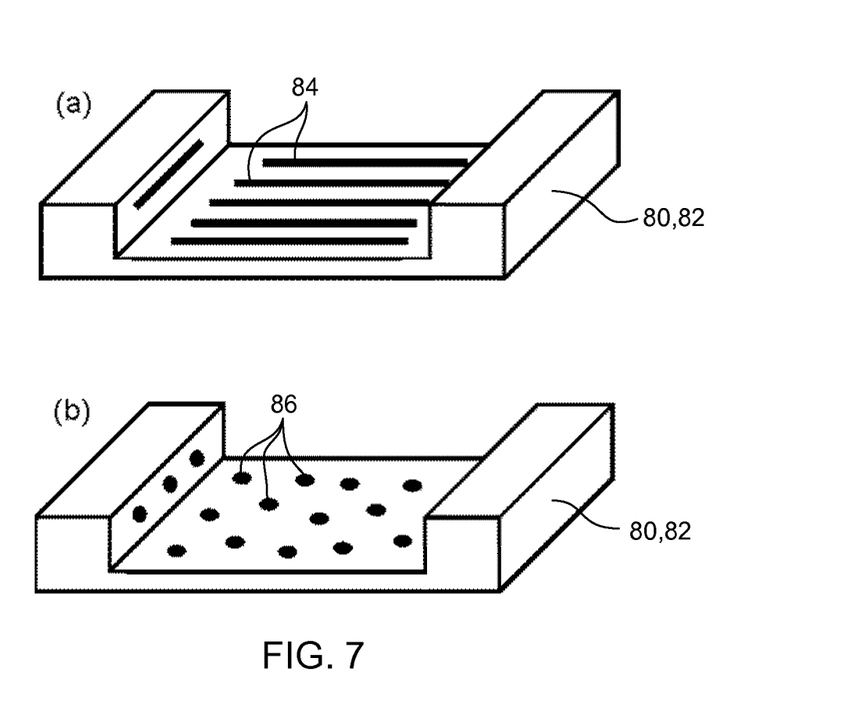
FIG. 7 is a detailed drawing of a perspective view of the reactor head. This figure is meant to show that the nozzles for input and extraction of gasses and vapors can be slots (a) or holes (b), or any other design, including slots interspersed with holes.

FIG. 6 is a close-up of the nozzles, slots or other orifices 84,86 on the reactor head 90. The spacing or sizes 88,89 of all of the channels can be tuned, to suit the chemistry and reactive flow conditions of the desired coating. All channel sizes can be tuned, including the reactant channel, the vacuum channel, and the purge channels. As another variation, a localized energy source may be provided, such as an RF potential across a portion of the head 90, or a flow of charged or otherwise high-energy reactant species may be fed.

Generally, glass sheets from draw processes can have a range of thicknesses. There are several drivers to sell thinner sheets of glass. For example, thinner sheets consume less glass per unit area, increasing the profit margin per part if all other cost variables remain the same. Thinner glass is also lighter, reducing the weight and (slightly) even the thickness of products that use large sheets of glass.

As glass sheet is made thinner, an increasing proportion of its inherent strength is determined by the surface properties of the glass. Thinner glass fractures mechanically at lower absolute stress values as compared to thicker glass. For this reason, it is increasingly important to use surface strengthening techniques, such as protective coatings, in order to optimize the strength of thin glass. This statement holds for sheets of glass as well as for other shapes, including glass fiber.

Vapor deposition is used herein for the coating of virgin glass. This is because vapor coating may bring several advantages for coating and therefore for strengthening of glass articles and surfaces. Vapor deposition can be highly conformal since vapor can contact all surfaces to which the vapor is exposed. Therefore, for coating of glass sheet, both the front and back sides, and edges of the sheet can be coated in one vapor deposition reactor. This conformality aspect is absent from physical vapor techniques such as sputtering and evaporation. If there are high aspect ratio features to be coated then vapors are able to penetrate deep down into these features during an exposure.

Being a vapor, the excess quantity of vapor exposed to the surface can be guided away quickly from the coated part using flushing with a flow of inert gas or alternatively by using vacuum pumping. Owing to the low density rarified properties of a gas, gasses are able to be flushed from a surface using inert gas purging. This permits the byproducts of a vapor deposition to be flushed away from the deposition surface quickly, using an inert gas push or a mild vacuum for transport of the byproducts. The key idea is the partial pressure of the first reactant vapor is sufficiently reduced so as to minimize the gas phase reactions with subsequent chambers of the next reactant vapor.

Vapor can be guided using gas curtain confinement technology. A curtain of an inert gas can be used to separate two other regions of gas, suppressing any potential intermixing or reactions.

A liquid source may be used for coating of a glass articles. Gas and vapor molecules exhibit much lower viscosities than liquids. This is because gasses and vapors are rarefied, where the ratio of liquid to gas densities is about a factor of 1000. Therefore, gas molecules move with far fewer collisions per unit length, than liquid molecules. Gasses and vapors are able to move into and also out of narrow crevices and high aspect ratio trenches very quickly as compared to liquids. This is an important aspect in regards to delivering film forming gasses to the bottom of narrow crevices and high aspect ratio trenches, such as microscopic cracks in glass surfaces.

Figure 8:
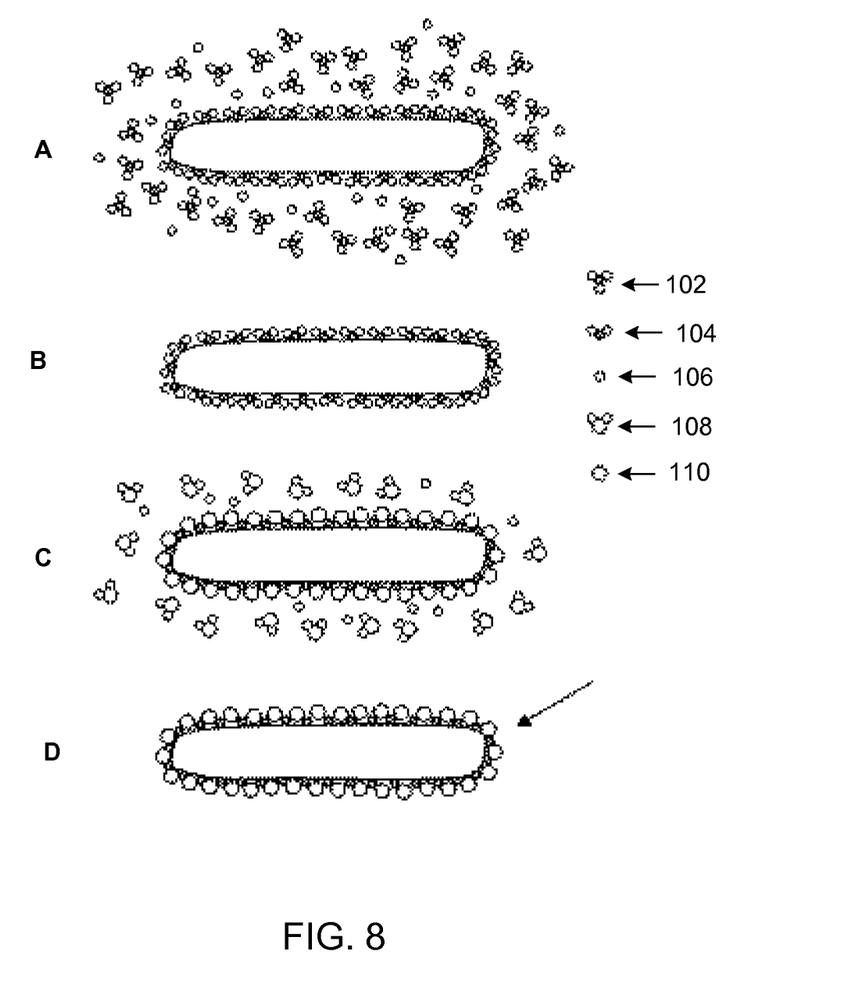
FIG. 8 illustrates an exemplary atomic layer deposition process.

A vapor coating technique that can be highly conformal as well as be used in conjunction with gas curtain confinement techniques described herein is Atomic Layer Deposition (ALD), an example of which is illustrated in four steps A, B, C, D in FIG. 8. During the example ALD coating process, the object to be coated must have an elevate temperature, which is not an issue for glass coming off a draw. The example ALD process consists of four sequential steps, A-D which are illustrated here with reference to deposition of $Al_2O_3$. A key to the illustrated molecular species is shown at the right, including trimethyl aluminum 102, dimethyl aluminum 104, byproducts 106, water 108, and atomic oxygen 110. Similar steps are relevant for the deposition of other materials. In the first step A, the sample is exposed to trimethyl aluminum (TMAl) vapor. During step A some aluminum atoms and compounds will bond to the surface of the sample. Byproducts, such as methane, may be eliminated during the surface adsorption event. In the second step B, the excess TMAl is purged away within a flow of nitrogen carrier gas (or other inert gas) or with a mild vacuum (or both). In the third step C, the sample is then exposed to an atmosphere of an oxidant, such as water. Some of the water will react with residual (monolayer) of adsorbed aluminum atoms and compounds that remain on the surface of the sample from the first step. This reaction results in the formation of a thin layer of $Al_2O_3$ on the surface of the sample, everywhere where the vapor has touched the surface. If enough time is allowed for the first TMAl exposure, then this coating of $Al_2O_3$ will occur across all surfaces of the sample, meaning that the film will be highly conformal. Conformality is a defining feature of this coating technique. In the fourth step D, the excess water molecules are swept away in a flow of a inert carrier gas (or a mild vacuum or both). All of these steps, one through four, can be repeated many times in order to increase the overall thickness of the coating. Each cycle (comprising steps 1 through 4) will result in the deposition of approximately an angstrom thick layer of $Al_2O_3$ film.

An approach is provided that permits continuous coating of thin glass, as would be required at the bottom of a glass fusion draw, providing uninterrupted operation. The separation of the oxidizing from the reducing vapors can be accomplished in space or in space and time. For separation spatially, separate nozzles can be used for the oxidant and reductant, and the sample can be swept past these nozzles effectively exposing the sample to the two gasses at different times. Alternatively, one nozzle can be used and the oxidant and reductant can be allowed to flow at different times in order to affect reactant separation. The application to freshly drawn glass, and thin glass, and using this technique in conjunction with gas curtain technology is described herein.

In addition to time and spatial separation one can also consider using a localized energy source to drive the formation of the desired oxidant or reductant to the proper chemical state on the glass surface different from the form they were transported in gas phase. Typically, in ALD processes the metal bearing precursor links to the surface. However, this reaction can be driven harder by the local application of additional energy. For example local UV illumination or local RF atmospheric plasma could be used to disassociate the transported gas.

ALD provides decreased particulate as compared to CVD, since it suppresses gas phase reactions by separating the oxidizing gas from the reducing gas in either time or space. The decreased particle formation can preserve the application of the glass article in microelectronics and other applications that are sensitive to particulate. Another aspect is that the metal bearing precursor links to the surface during one distinct step in the ALD process. All of the chemical potential of the precursor is available for reaction with the surface of the glass article only. Then, excess precursor is purged away. The metal that remains on the article is now in intimate contact, likely chemically bonded with the surface of the glass article. Then as subsequent step oxidizes the thin partial or possibly complete monolayer of metal material while it is in intimate contact with the glass. Separating out the metal deposition from the oxidation step is likely to increase the adhesion and bonding with the surface as compared to CVD technologies. The reason is, in CVD there are also gas phase reactions that can consume some of the chemical potential of the metal precursor prior to its transport to the surface of the glass. This can result in the depositing material forming a less intimate bond with the surface of the glass. This may be referred to as a vapor phase deposition, instead of just ALD. The perfect purging realized in vacuum ALD is not necessary in order to enhance the bonding of the metal. Only that the partial pressure of the metal precursor is reduced sufficiently low in the subsequent steps to control and minimize any subsequent undesired vapor phase reactions. Rather, a partial or mostly complete bonding as facilitated by purging and mild vacuum is sufficient to separate out the ALD process for coating of just formed glass.

An additional distinction between the atmospheric ALD-like vapor deposition technique here and CVD is that in CVD the precursors are 'cracked' thermally (usually) in order to make reactive intermediated that bond with the substrate that is being coated. The cracking can happen in the gas phase or on the surface (heterogeneously or homogeneously). In the technique described herein, the chemical energy of the molecules and their innate propensity to react is what drives the coating. Subsequently, the temperature of CVD coating tends to be many hundreds of degrees Celsius (typically over 500), whereas in ALD type depositions the temperature can be room temperature, but is usually 100 to 300 degrees Celsius. The elevated temperature helps with driving off the byproducts from the surface reactions, among other physical events (like increasing reaction rates).

Many materials can be deposited by ALD type (two step) reactions, including oxides ($Al_2O_3$, $SnO_2$, $ZrO_2$, etc.), nitrides (TiN, AlN, $Si_3N_4$), metals (Pt, Rh, Ti, Mo, etc.) and fluorides ($CaF_2$, $MgF_2$, etc.).

It is conceivable that two step reactions with other precursors can be considered resulting in materials that do not form hydrogen bonds, cannot be wet etched, or both. One example would be SiC like material system. SiC does not form any hydrogen bonds with water and it cannot be wet etched. Forming stoichiometric SiC from simple precursors requires a large amount of activation energy to be applied, but using more complex precursors of alcohols and silanols or other molecular chains with conjugate bonds can lower the reaction barriers and increase the reactivity of the precursor species.

Another aspect is that the metal can react with the surface oxygen of the glass, thus binding it. It brings a sort of drying aspect to the initial few nanometers of the glass surface. The subsequently deposited film also bestows a hermetic aspect, conformal over all sides and edges of the glass. This may seal potassium or other ions, or water, inside of the glass article. This feature may prevent potassium or other ions, or water, inside of the glass article from leaving the glass article and polluting a subsequently deposited film, including thin film transistors. Likewise, this conformal film seals out a broad range of materials including oils, alkalis, water, metallics, etc.

The above-described coating processes can provide some mechanical protection of the surface before it is damaged, similar to that found in the bottling industry. One of the most prevalent applications of coatings is in the area of protection of glass articles. For example, one of the largest applications for chemical vapor deposition, by surface area, is coating of newly formed hot glass bottles and containers as they are funneled through a packaging plant on a conveyor belt. As the glass bottles move along the conveyor belt they will oftentimes jostle around, bumping and abrading against one another. This abrading activity can cause surface scratches and marring. The customers that purchase these bottles, including beer brewing companies, do not want the bottles to have visible surface scratches since the scratches reduce the shelf appeal of the product. A thin oxide coating (tin or titanium oxide) is often used to protect these glass bottles, in combination with a waxy lubricious coating (a wax) over the oxide. The most common film application methods employed by the glass container industry are to use either a spray or a fogging technique for application of these coatings.

The surface energy of a glass article may be reduced through the addition of the thin coatings. Reducing the surface energy also reduces the reactivity of the surface of the glass article and the tendency of the glass article to stick or chemically react with other surfaces with which the glass article may come into contact. These "other surfaces" include other glass articles that rub against the coated glass article. In the absence of a coating, this rubbing may cause surface marring. Thin glass will be rolled onto drums, making a situation where surface protection is a primary concern.

The metal oxide can be harder than the plain glass surface. $SnO_2$, $Al_2O_3$ and many other oxides can be harder than plain silicon oxide glass materials. The increased hardness of metal oxides will improve scratch resistance of glass articles.

Many metal oxides can have a much lower Water Transpiration Rate (WTR) as compared to virgin glass surfaces. Water can move into the glass through its surface and lead to swelling and formation of a gel-like layer. Uptake of water and swelling of the glass can cause changes in the internal stresses that exist near to the surface of the glass article (the surface stress). Therefore, a thin film may prevent the transpiration of water into glass articles, which therefore could prevent mechanical weakening associated with water transpiration into a glass surface and any modification of the reactivity of the glass surface. The diffusivity of water through many oxides is low. In particular, diffusivity of water through amorphous $Al_2O_3$ is extremely low. Also, the WTR through tin oxides can be low, especially for tin oxides that are sub-stroichiometric in oxygen.

The surface of freshly formed glass can have low water content. This is because the glass is formed at such high temperatures that the water is driven off from the starting materials. However, as the glass cools, the metal and silicon oxide bonds at the surface are liable to react with atmospheric water, forming M-OH and Si—OH bonds. These bonds are able to still further interact with water by formation of hydrogen bonds. This interaction leads to build-up of a thin water layer on the surface of the glass after it has cooled. The water layer can facilitate further interactions such as reaction of alkaline earths in the glass to form hydroxides, or further reaction of alkaline earths with carbon dioxide to form alkaline earth carbonates. These reactions are essentially an etching of the glass surface, and can degrade the mechanical durability of the glass sample.

The main facilitator of these reactions is the interface between the bare glass and the thin water layer. When a thin homogeneous tin oxide, aluminum oxide, or titanium oxide is interspersed between the fresh glass surface and the subsequent water layer, the reactions with alkali and alkaline earths is suppressed. This is the reason that glass articles coated with metal oxides while they are still hot (called hot end coating in the literature, referring to coating of glass bottles just after formation). Titania may also be used to preserve the surface strength of glass containers. However, the coating must exist on all sides of the glass article, including top, backside, and edges. Otherwise, the coating only provides partial protection, leaving points of failure.

Another factor in the choice of a coating is the etch resistance of the thin film coating. It is known that water adsorbed from the environment may contain trace atmospheric chemicals resulting in a non-neutral pH. Acidic or basic conditions will facilitate the chemical breakdown of many types of thin films. Thus it may be beneficial to choose thin films that are highly resistant to water based etching. Tin oxide is one example.

As another example, optical fibers are tested for their tensile break strength. During this test the fibers are put into tension and pulled to their ultimate yield strength. The ultimate yield strength is improved if the glass is coated immediately after the fiber draw in order to preclude hydration of the surface of the virgin glass by atmospheric water. If the coating is applied immediately after the draw, on the virgin glass surface, then the yield strength can be increased. Fiber optic cable undergoes a reduction in its tensile strength if it is aged in humid environments.

It will be apparent to those skilled in the art that various modifications and variations can be made to the embodiments described herein without departing from the spirit and scope of the claimed subject matter. Thus, it is intended that the specification cover the modifications and variations of the various embodiments described herein, provided such modification and variations come within the scope of the appended claims and their equivalents.

What is claimed is:
1. A method of coating a surface of a glass ribbon during a drawing process using vapor deposition, the method comprising:
   forming a glass ribbon in a viscoelastic state;
   drawing the glass ribbon in the viscoelastic state;

cooling the glass ribbon in the viscoelastic state into an elastic state;

directing the glass ribbon into an open end of a reactor, the reactor including multiple channels, wherein at least a first channel directs a first reactant gas, at least a second channel directs a second reactant gas and at least a third channel directs a flow of inert gas or draws a vacuum;

directing the first reactant gas from the first channel onto the glass ribbon within the reactor;

directing the second reactant gas from the second channel onto the glass ribbon within the reactor;

controlling the position of the glass ribbon within the reactor by balancing the glass ribbon between opposing flows of gas; and purging the excess reactant away from the glass ribbon by inert gas flow from the third channel within the reactor or by drawing away excess reactant through the third channel within the reactor.

2. The method of claim 1 further comprising forming a coating of an oxide on the surface of the glass ribbon selected from a group consisting of $Al_2O_3$, $SnO_2$ and $ZrO_2$.

3. The method of claim 1, wherein the first reactant gas is TMAl.

4. The method of claim 1, wherein the second reactant gas is water.

5. The method of claim 1, further comprising the step of providing a reactor having a removable portion of a width equal to a width of the glass ribbon.

6. The method of claim 1 further comprising avoiding contacting the surface of the ribbon with any solid object while the ribbon is within the reactor.

7. The method according to claim 6 comprising both the step of purging the excess reactant away from the glass ribbon by inert gas flow and the step of purging the excess reactant away by drawing away excess reactant.

8. The method according to claim 6 wherein the step of forming comprises employing a fusion draw.

* * * * *

UNITED STATES PATENT AND TRADEMARK OFFICE
CERTIFICATE OF CORRECTION

PATENT NO. : 10,106,457 B2
APPLICATION NO. : 14/359806
DATED : October 23, 2018
INVENTOR(S) : Robert Addison Boudreau et al.

It is certified that error appears in the above-identified patent and that said Letters Patent is hereby corrected as shown below:

On the Title Page

On page 2, Column 2, item (56), other publications, Line 5, delete "Feb. 15, 2013." and insert -- Feb. 5, 2013. --, therefor.

Signed and Sealed this
Nineteenth Day of January, 2021

Andrei Iancu
*Director of the United States Patent and Trademark Office*